(12) United States Patent
Gleissner

(10) Patent No.: US 10,664,055 B2
(45) Date of Patent: May 26, 2020

(54) CONTROL DEVICE WITH SEVERAL CONTROL ASSEMBLIES AND HAPTIC FEEDBACK, AND PROCESS FOR MANUFACTURING THE CONTROL DEVICE

(71) Applicant: PREH GMBH, Bad Neustadt a. d. Saale (DE)

(72) Inventor: Ottmar Gleissner, Hohenroth (DE)

(73) Assignee: PREH GMBH, Bad Neustadt A. D. Saale (DE)

( * ) Notice: Subject to any disclaimer, the term of this patent is extended or adjusted under 35 U.S.C. 154(b) by 150 days.

(21) Appl. No.: 15/730,138

(22) Filed: Oct. 11, 2017

(65) Prior Publication Data

US 2018/0150137 A1    May 31, 2018

(30) Foreign Application Priority Data

Nov. 29, 2016  (DE) .................... 10 2016 122 977

(51) Int. Cl.
| | |
|---|---|
| *G06F 3/041* | (2006.01) |
| *G06F 3/01* | (2006.01) |
| *G06F 3/0488* | (2013.01) |
| *G06F 3/0354* | (2013.01) |
| *H01L 41/09* | (2006.01) |
| *H01F 7/08* | (2006.01) |
| *H01H 3/00* | (2006.01) |

(52) U.S. Cl.
CPC .......... *G06F 3/016* (2013.01); *G06F 3/03547* (2013.01); *G06F 3/0488* (2013.01); *H01L 41/09* (2013.01); *H01F 7/08* (2013.01); *H01H 2003/008* (2013.01)

(58) Field of Classification Search
None
See application file for complete search history.

(56) References Cited

U.S. PATENT DOCUMENTS

| | | | |
|---|---|---|---|
| 2015/0177314 A1* | 6/2015 | Tran ................. | G01N 27/02 324/756.05 |
| 2016/0011684 A1* | 1/2016 | Zhang ............... | G06F 3/0202 345/173 |
| 2018/0150137 A1* | 5/2018 | Gleissner ........... | G06F 3/016 |
| 2018/0350535 A1* | 12/2018 | Maier ................ | G06F 3/044 |

FOREIGN PATENT DOCUMENTS

| | | |
|---|---|---|
| DE | 102011117120 A1 | 5/2012 |
| DE | 102015107828 A1 | 11/2016 |

* cited by examiner

*Primary Examiner* — Carl Adams
(74) *Attorney, Agent, or Firm* — M&B IP Analysts, LLC

(57) ABSTRACT

The present disclosure relates to a control device with at least one touch-sensitive input surface that can be activated for haptic feedback with an electromagnetic actuator, where the actuator comprises an actuator coil and an armature that is activated by energizing the actuator coil. The control device is divided into at least two control assemblies at least one of which has a touch-sensitive input surface and an armature connected therewith. These at least two control assemblies are installed at a minimum spacing from each other on a common circuit board, which in turn is connected with a common carrier element, whereby the armatures protrude through the circuit board with play. On each carrier element, an actuator coil at a spacing x from the armature of the respective control assembly is installed. The present disclosure also refers to a process for manufacturing the control device.

6 Claims, 6 Drawing Sheets

CONTROL DEVICE WITH SEVERAL CONTROL ASSEMBLIES AND HAPTIC FEEDBACK, AND PROCESS FOR MANUFACTURING THE CONTROL DEVICE

This application claims priority to the German Application No. 102016122977.6, filed Nov. 29, 2016, now pending, the contents of which are hereby incorporated by reference.

DESCRIPTION

The present disclosure relates to a control device with at least one touch-sensitive input surface that can be activated for haptic feedback with an electromagnetic actuator, for which the actuator comprises an actuator coil and an armature that is activated by energizing the actuator coil.

The present disclosure also relates to a process for manufacturing such a control device.

In the area of control and input devices, electromagnetic actuators are often used to facilitate a control function. Such actuators can also be used to generate haptic effects in control elements. For example, increasingly touch-sensitive input surfaces such as touchpads and touchscreens are used in electronic devices. This applies in particular to mobile telephones and other mobile devices, but also to user interfaces in motor vehicles. Users can enter inputs via a touch-sensitive input surface to control certain functions of a device or motor vehicle. Users can touch a site on the input surface with the finger or slide the finger across a part of the input surface or across a certain section. Sensors detect the position of such touch areas and also of motion patterns, whereby for example a matrix of capacitive sensors can be used. The position data thus detected are substantially transmitted to a computer unit which derives and implements the function which the user wants.

To provide a user with the feedback that an input has been successful and/or to support the user with orientation on an input surface, it is known to have control devices disposed with means for haptic feedback. To accomplish such feedback, the input surface is briefly activated such that the user feels a short vibration in the finger.

Depending on the kind of stimulation, this activation can be orthogonal or parallel to the input surface. Furthermore, different mechanisms can be used to activate the surface. In particular, these include piezoelectric elements and the said electromagnetic actuators.

In an electromagnetic actuator, an electrical impulse generates an electromagnetic field in at least one coil to move an armature on a certain path depending on the voltage applied to the coil. Thus, the actuator generates a certain force that can be used for a switching function or the stimulation of a surface of a control device. The actuators can have flat armatures or plunger armatures. However the forces generated by a flat-armature actuator are considerably greater that in a plunger-armature actuator of the same size, which means that flat-armature actuators are usually preferred. In particular, in large systems such as touchscreens or touchpads, plunger-armature actuators are usually too weak, which means that flat-armature actuators are usually used with such systems.

Furthermore, a control device that is relatively large and heavy is more demanding in terms of the actuator technology and mechanics it uses. Therefore, it is often preferred to use smaller actuators and mechanisms that are not as massive. To achieve this, it can be provided that a control device is divided into several appropriately smaller subunits and to equip each of these with its own active haptics. In motor vehicle control devices, this is particularly useful when a control device is meant to be used by the driver as well as by the front-seat passenger. This is the case, for example, in mid-vehicle panels having a left-hand and a right-hand control unit. In such a case, either the driver or the front-seat passenger can use the control unit to adjust certain settings such as air conditioning or changing the position of a seat. This mid-vehicle control can also have control sections that can be used by both persons.

However, when several control units with their own haptics are provided in a mid-vehicle panel, the optical integrity of the entire control device should be maintained. In particular, there should only be a very small gap between the individual control units, for example of less than 1 mm in width, taking the movement of the individual control unit for haptic feedback into account.

It is therefore the object of the present disclosure to provide a control device that is divided into at least two control assemblies one of which has a touch-sensitive input surface and an actuator for haptic feedback on this input surface, whereby the control device is simple to install as long as predetermined dimensions of the gap measurements are observed.

According to the present disclosure, this object is achieved by a process according to independent claim 1. Advantageous embodiments of this process are described in subclaims 2-6.

It should be pointed out that the characteristics individually described in the claims can also be combined in any technically useful manner, and that the present disclosure is further described by other embodiments. In addition, the description characterizes and specifies the present disclosure particularly with reference to the drawings.

The control device according to the present disclosure comprises at least one touch-sensitive input surface, which can be activated with an electromagnetic actuator for haptic feedback. For this purpose, the actuator comprises an actuator coil and an armature that can be activated by energizing the actuator coil. According to the present disclosure, the control device is divided into at least two control assemblies, at least one of which has a touch-sensitive input surface and an armature connected therewith. The at least two control assemblies are installed with a minimum spacing on a common circuit board which in turn is connected to a common carrier element, whereby the armatures protrude right through the circuit board with play. On the carrier element, an actuator coil is installed for each control assembly with a touch-sensitive input surface with a spacing x from the armature of each control assembly.

Such a control device has the advantage that several different control assemblies can be aligned on a common circuit board and a common carrier element and installed such that predetermined spacings can be maintained for the gap between the control assemblies. This has the effect that the control device has the optical appearance of one unit although it is divided into several control assemblies. It can also be taken into account that the touch-sensitive input surface of at least one control assembly moves for haptic feedback.

The individual components of the control device can be pre-installed separately of each other and combined with each other afterwards. For this, all components can be firmly connected to other. However, it is also possible to connect the control assemblies to the carrier element right through the circuit board such that the circuit board is firmly held between the control assemblies and the carrier element. In one embodiment of the present disclosure, the common carrier element is therefore connected right through the circuit board, in particular by screw means. Thus, the carrier element only has to be screwed to the aligned control assemblies, whereby the circuit board is sandwiched between the control assemblies and the carrier element. In this, the carrier element can already be provided with the actuator coils for the actuators of the control assemblies with haptic feedback while the associated armatures are installed in the control device only after alignment and fixation of the control assemblies.

In one preferred embodiment of the present disclosure, the control device has at least two control assemblies, each with a touch-sensitive input surface and an armature connected therewith. Thus, two control assemblies can be provided with their own haptics and also be aligned with each other. Apart from these two control assemblies, other control assemblies with their own haptics, but also control assemblies without haptics can be integrated in the control device.

To align the circuit board with the control assemblies, at least one control assembly is provided with a pin, by which the position of the circuit board versus the control assemblies is determined, with the pin extending into a matching hole in the circuit board. The approximate position of the circuit board versus the control assemblies is determined by this connecting point, but the circuit board can be rotated about the pin to align certain points of the circuit board with the control assemblies. In particular, these points are clearance holes for the screw connections and/or recesses to lead the armatures from the control assemblies to the actuator coils on the carrier element.

When using electromagnetic actuators in control devices, it is also desirable to keep the size and the cost as low as possible. To ensure efficient use, the spacing between the armature and the coil core should be kept at a minimum with a defined maximum deflection. Typically, this spacing is between 0.1 and 0.8 mm. In connection with the fact that the force generated by the flat armature depends on the spacing between the armature and the coil (the force displacement curve), it is a problem in the manufacture of flat-armature actuators to exactly position the coil body in relation to the armature. For this, the armature must be installed in a control assembly at a certain position.

To align an armature with a control assembly, an armature in one embodiment of the present disclosure comprises at least one connecting element which is positively connected with a corresponding element of the control assembly. When several control assemblies with actuators are used in the control device, each armature of the several actuators can be aligned with its actuator coils to meet the requirement for each actuator for a spacing between the actuator coil and the armature. However, since the prior alignment of the control assemblies with each other and with the carrier element can lead to different spacings between the actuator coils and the points on the individual control assembly, it is preferable that different armatures are installed in the control assemblies. In particular, the armatures differ only in the arrangement of the at least one connecting element while the armatures are otherwise identical. The different arrangement of one or more connecting elements in different armatures means that in each armature there is a different spacing x between each armature and the associated actuator coil. When—in assembling the control assemblies, the common circuit board and the common carrier element—different spacings are found between the actuator coils and the respective control assemblies, these variations can be very well compensated for by selecting and installing an armature that fits the previously measured spacing d for each control assembly with an actuator.

In this, the armatures are preferably designed as flat armatures in the form of angular members. In the installed state of such a flat armature, the outer surface of a first leg of the angular member points toward the associated actuator coil while the at least one connecting element is disposed on the second leg. In that case, the angular member is connected with the control device via the second leg.

Therefore, the present disclosure also refers to a process for manufacturing a control device with at least the following steps:

a) providing at least two control assemblies, at least one of which comprises a touch-sensitive input surface and an assembly site for installing an armature;

b) inserting the at least two control assemblies in an installation means in which the control assemblies are aligned with a minimum spacing between each other;

c) attaching a common circuit board to the at least two control assemblies, whereby the circuit board has at least one recess through which an armature can pass;

d) connecting a common carrier element with the at least two control assemblies and the circuit board, whereby one actuator coil is attached to the carrier element for a control assembly with a touch-sensitive input surface; and e) installing one armature to each control assembly with touch-sensitive input surface, whereby the armature passes through the recess in the circuit board and is installed at a spacing x from a corresponding actuator coil of the carrier element on the respective control assembly.

Preferably, the carrier element is screw-connected with the control assemblies through the common circuit board. Furthermore, the installation means can be removed after the carrier element is connected to the control assemblies and the circuit board. Thus, it only serves to align the control assemblies until the connection/screw connection is accomplished; it is not a component of the resulting control device.

For manufacturing the control device according to the present disclosure, it is preferably provided that a suitable armature is selected for a control assembly with haptic feedback, depending on a predetermined spacing d between an actuator coil and a point on the respective control assembly. In case of several control assemblies with haptic feedback, various kinds of armatures may be installed since the predetermined spacing d may vary among the individual control assemblies. In one embodiment of the present disclosure, at least two armatures are made available for this, each of which has at least one connecting element for connecting the respective armature with a control assembly with touch-sensitive input surface. The connecting element is arranged differently on the two armatures.

After the carrier element is connected with the at least two control assemblies and the circuit board, the spacing d between an actuator coil and a defined point in the associated control assembly is determined. Then an armature is selected from all the armatures which, when connected with the control assembly, is at an actual spacing x from the actuator coil, which corresponds to a certain specification. The determination of the actual spacing x depends on the predetermined spacing d. The armature thus selected is installed on the associated control assembly, whereby the armature passes through a recess in the common circuit board.

If several control assemblies with an actuator for an haptic feedback are used in the control device on a touch-sensitive input surface, this process is carried out for each of these control assemblies. Thus, a suitable armature is selected for each control assembly with an actuator for a haptic feedback. Each armature is adapted to the spacing between the actuator coil and a point on the respective control assembly which results from the previous alignment of the control assembly.

In particular, that armature is selected which is at an actual spacing x from the associated actuator coil when connected with a control assembly, which spacing can be greater than a pre-determined target spacing X and has the smallest deviation from this reference spacing X. This is to ensure that the spacing X does not fall below the target. This target spacing X is as narrow as possible when the material deflection of the flat armature is taken into account, and may for example be in the range of 0.1-0.8 mm. Remaining tolerances can be minimized by means of targeted control of an actuator. For example, deviations remaining between the actual spacing x and the predetermined target spacing X between the flat armament and the actuator coil during operation of the actuator can be minimized by means of a targeted control of the flat armature.

It is thus possible with this process to select the appropriate flat armature for a gap resulting during production between the actuator coil and a point on a control assembly. Thus, suitable flat armatures can be selected and installed even during the production of the control device, which facilitates subsequent calibrations of the actuators. The different arrangement of one or more connecting elements on the flat armatures when the different flat armatures are installed has the effect that there is a different spacing x for the associated actuator coil.

After installation of the selected flat armature, the resulting actual spacing x between the actuator coil and the flat armature is known with relative accuracy and can be taken into account in the calibration and control of the actuator. It means that there is no need for the further measuring of the actual spacing x between the actuator coil and the flat armature in the installed state.

The touch-sensitive input surface of a control assembly, which is to be activated for haptic feedback, can have touch-sensitive sensors, for example, in the form of a matrix of capacitive sensors to determine the necessary position data when the input surface is touched. Such a touch-sensitive input surface can be activated for haptic feedback either orthogonal or parallel to the direction of its extension. In a preferred embodiment of the present disclosure, the surface is stimulated parallel to the direction of its extension. In that case, the input surface is movably mounted within its control assembly and connected directly or indirectly with the flat armature of the electromagnetic actuator. This can be accomplished for example by means of a carrier consisting of one or more carrier elements. The actuator then activates the carrier/s which in turn is transferred to the input surface which is stimulated along the direction of it extension. Span d is measured in a state in which the input surface is installed in its normal idle position.

A control assembly may comprise one or more actuators to activate a surface for haptic feedback. For example, known embodiments provide an actuator in a mid section below a touch-sensitive input surface.

Preferably, one or more armatures are selected by a computer unit to which the measured spacings d have been transmitted before, to be subsequently evaluated. The determined spacing d is thus transmitted to a computer unit which subsequently performs the selection of a suitable armature. This computer unit possesses Information about the dimensions of each armature among the quantity of armatures available and can thus select an armature which complies with the desired specification. Span d can be determined with a camera which is electronically linked to the computer. For example, the computer unit can—after the evaluation of a camera image—indicate a suitable flat armature on a screen which is then installed on the control device. This installation can be manual or by automation such that the computer unit can also control a robot directly to pick the armature from the quantity of armatures and install it between the actuator coil and a control assembly.

In particular, the present disclosure can be used advantageously when an armature on a control assembly is connected with a plastic part to which a touch-sensitive input surface of a touchscreen or touchpad is installed. For example, such a plastic part can form a frame in or on which a touch-sensitive input surface is mounted. The motion of the armature is then transferred to the input surface for haptic feedback.

When connecting the armature with the plastic part via a screw connection, the applied screw torque can cause the armature to twist in relation to the plastic part. This can be avoided with the at least one connecting element on the armature if such a connecting element is positively connected to a corresponding element on the plastic part. In that way, the position of the armature in relation to the plastic part is fixed, and the armature cannot twist when it is subsequently connected to the plastic part.

Furthermore, when an armature made of metal is connected via a screw connection to a carrier made of plastic, there can be disadvantages due to the materials and especially due to the difference in the materials. For example, both materials have different settling characteristics since they react differently to temperature fluctuations. This can also lead to the armature twisting in relation to the carrier when the actuator is in operation.

With at least one connecting element on the armature with which the armature can be aligned with one or more carrier elements, such disadvantages can be avoided However, such an alignment has the result that after installation in a control assembly, the armature can no longer be activated such that the spacing can be adjusted between it and the actuator coil. Therefore the process according to the present disclosure is particularly advantageous when it is used for such armatures. When several armatures with different arrangements of connecting elements are provided, an armature can specifically be chosen and installed with which a resulting distance x can best be implemented between the actuator coil and the armature. That way, the advantages of an armature with a connecting element to align with a carrier element can be used while at the same time, the resulting disadvantages are eliminated.

Other advantages, special features and useful further developments of the present disclosure are described in the subclaims and by means of the attached drawings of preferred embodiments, where FIG. 1 shows a three-dimensional view of an embodiment of a control device according to the present disclosure;

Figure 1:
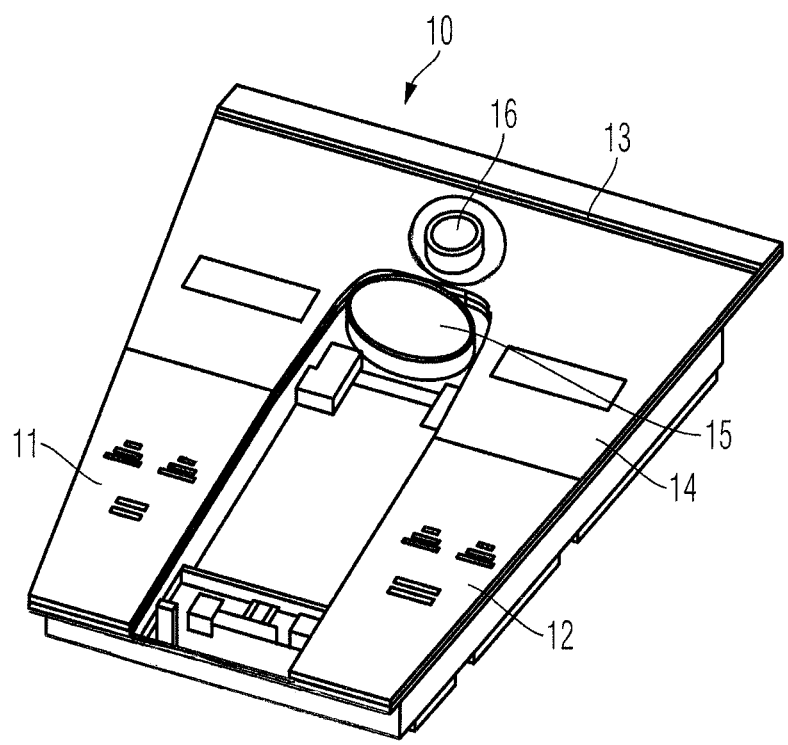

The present disclosure is described by means of an example in the form of a control device that can be installed in the mid panel of a motor vehicle. However, the present disclosure can also be applied in other kinds of control devices. The chosen control device is of U-shaped form with two lateral control units which can be operated by the driver or the front-seat passenger, each on their side of the vehicle. In the front section is a third control unit that can be operated by both persons. FIG. 1 shows such a control device 10 with two lateral control units 11 and 12 and a front control unit 13. Below, the lateral control units 11, 12 are also referred to as the first and second control units, while the front control unit 12 is referred to as the third control unit.

In this embodiment of a control device with several separate control units, each of the two lateral control units 11, 12 has a touch-sensitive input surface which can be activated for haptic feedback by means of electromagnetic actuators. For example, the touch-sensitive surface can be a touchpad or touchscreen. On the other hand, the third control unit 13 can be designed without such haptics. For example, the third control unit can comprise a rocker switch 14, a rotating drum 15 and a rotating reset 16.

Figure 2:
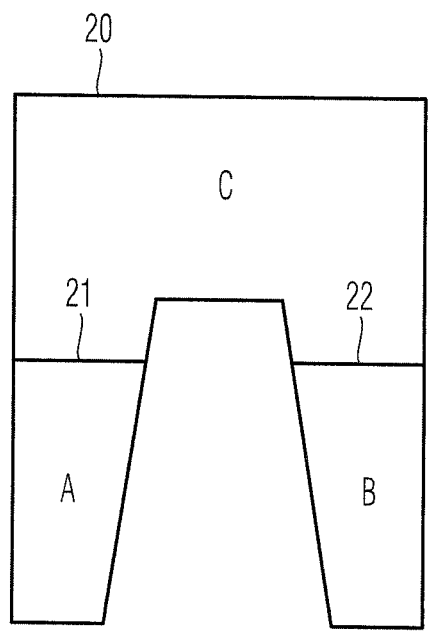
FIG. 2 shows the division of a control device into three assemblies inside an installation means.

The control device 10 is thus divided into three separate control units which are installed together in the central panel. This arrangement can also be seen in FIG. 2. The two lateral control units are arranged in the installation sections A and B while the third control unit is arranged in the front installation section C. Accordingly, the installation means 20 is formed as a kind of frame into which the prefabricated control assemblies are placed. The seams 21 and 22 between the installation section C and the installation sections A and B represent the spacing between the different control assemblies.

Figure 3:
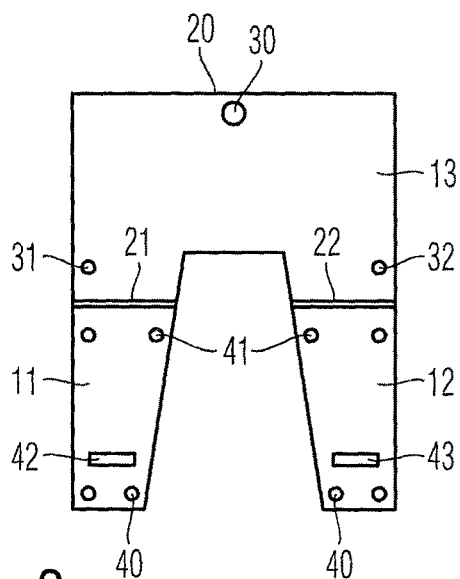
FIG. 3 shows a top view of an installation means with three control assemblies installed.

FIG. 3 shows such an installation means 20, into which three prefabricated control assemblies 11, 12 and 13 were placed. Each of these control assemblies can have their own control elements, screens, etc. In particular, the two lateral control assemblies 11 and 12 with their touch-sensitive input surfaces have assembly sites 42 and 43 where an armature, in particular a flat armature can be installed. This armature, together with an associated actuator coil, forms an electromagnetic actuator with which touch-sensitive input surfaces for both control assemblies 11 and 12 f can be activated for haptic feedback. For this purpose the respective input surface is movably installed inside its prefabricated control assembly.

Each control assembly 11, 12 has its own actuator such that the touch-sensitive input surfaces of the two control assemblies can be stimulated separately of each other. Since in this embodiment, the third control assembly has no haptics, no assembly site for an armature is necessary here. The prefabricated control assemblies 11 and 12 also do not have an armature yet which will only be installed at a later stage.

The two control assemblies 11 and 12 are also comprised of several screw connections 40 and 41. In addition, several pins are provided on the third control assembly 13. In the embodiment of FIG. 3 these are a central pin 30 and two lateral pins 31 and 32 near seams 21 and 22.

Figure 4:
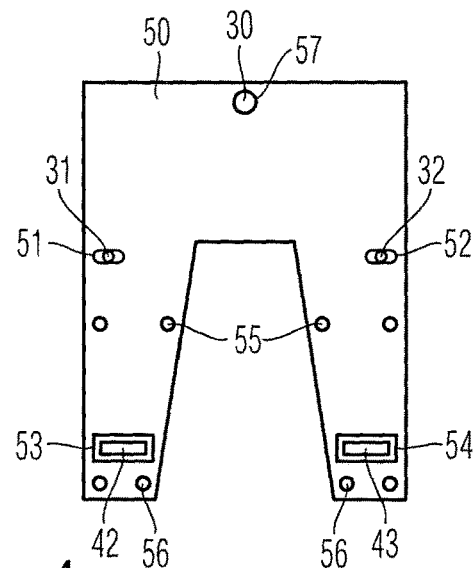
FIG. 4 shows a top view of an applied circuit board.

A fluid barrier (not shown) can be loosely laid over the thus prepared three control assemblies 11, 12 and 13. Then a common circuit board 50 is overlaid as FIG. 4 shows in top view. The outer contour of circuit board 50 substantially matches the outer contour of the arrangement consisting of the three control assemblies 11, 12, 13. The circuit board also comprises several openings. To align the circuit board with the three control assemblies 11, 12, 13, it has several openings through which the pins of the third control assembly 13 are fitted. The front pin 30 is custom-fit into a front matching hole 57. The two pins 31 and 32 on the other hand are fitted through two longitudinal holes 51 and 52 such that circuit board 50 can be rotated about pin 30 in matching hole 57 and thus aligned with the control assemblies whereby the two pins 31, 32 move inside longitudinal holes 51, 52. In particular, circuit board 50 is aligned with the three control assemblies 11, 12, 13 such that the two recesses 53 and 54 of circuit board 50 are placed such that the armature to be installed later can be placed through these recesses 53, 54 to assembly sites 42 and 43 of the two control assemblies 11, 12. Furthermore, several clearance holes 55 and 56 are positioned flush with the screw connections 40, 41 of the two control assemblies 11, 12.

Figure 5:
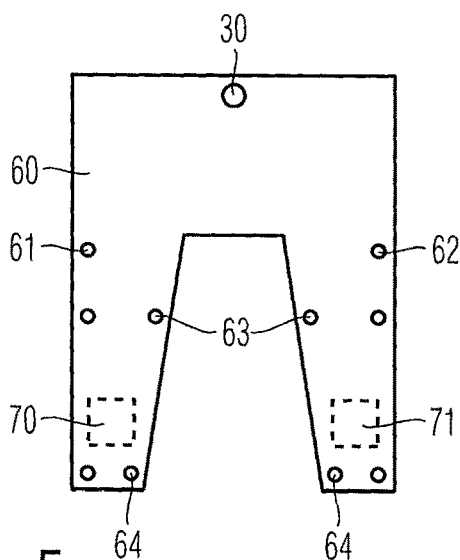
FIG. 5 shows a top view of an applied carrier element.
Figure 7A:
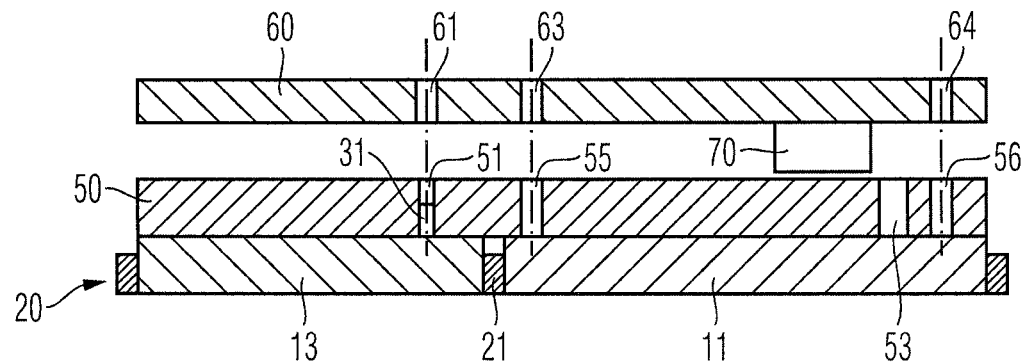
FIG. 7a shows a schematic section of a control device without an installed armature.

A carrier element 60 is laid onto the thus positioned circuit board 50 as shown in FIG. 5. To this carrier element 60, actuator coils 70 and 71 are attached for each control assembly 11, 12. These coils jut out from the carrier element 60 in the direction of circuit board 50 as is also shown in FIG. 7a. The carrier element 60 is positioned such that the actuator coils 70, 71 are in the section of installation sites 42, 43 for the armature, thus to form the respective electromagnetic actuators when the armatures are subsequently installed. The carrier element 60 as well as circuit board 50 are provided with several openings which are aligned to be flush with the openings in circuit board 50. Thus, several clearance holes 61, 62, 63 and 64 are provided, which—depending on the alignment of the carrier element 60—are in the area of pins 31 and 32 of control assembly 13 and screw connections 40 and 41 of control assemblies 11, 12.

After the positioning of carrier element 60, it is connected via circuit board 50 with the control assemblies 11, 12, 13. This is done for example via a screw connection with pins 31 and 32 of control assembly 13 and the screw connections 42 and 43 of control assemblies 11 and 12. The screw connections are at least led through clearance holes 55, 56 in circuit board 50 and through clearance holes 61, 62, 63 and 64 in carrier element 60. In this way, carrier element 60 is firmly connected with the three control assemblies 11, 12, 13, whereby circuit board 50 is held sandwiched between carrier element 60 and the three control assemblies 11, 12, 13.

Figure 6:
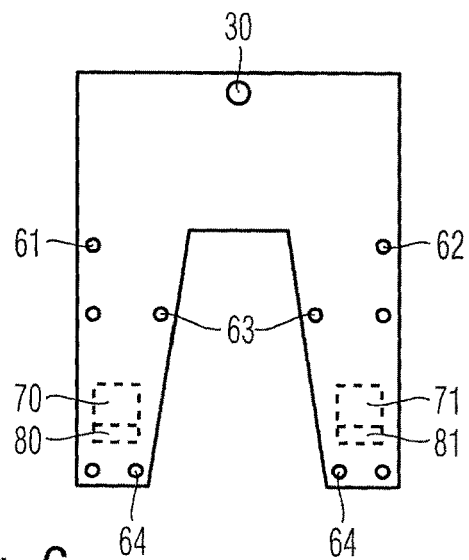
FIG. 6 shows a top view of a carrier element with applied armatures.

Subsequently, the bond thus formed can be taken from installation means 20. Before or after this removal, armatures 80 and 81 are installed on both control assemblies 11, 12 as is shown in schematic top view in FIG. 6. For this, the armatures are led through recesses 53 and 54 in circuit board 50 and fastened at the assembly sites 43, 43 of the two control assemblies 11, 12.

FIG. 7a shows this arrangement again in a schematic section through the front control assembly 13 and a lateral control assembly 11. These two control assemblies 13, 11 are inserted and aligned in the frame of installation means 20 such that due to seam 21 they lie at a desired spacing to each other. Circuit board 50, which was laid on it, is aligned via at least pin 31 with control assemblies 11, 12. Carrier element 60 is connected via several screw connections with the pin of the third control assembly 13 and via screw connections with the first control assembly 11. The actuator coil 70 of carrier element 60 points in the direction of circuit board 50, such that there is a spacing between these two components. This can be achieved by means of spacers (not shown) or a certain deformation of carrier element 60. In the state shown in FIG. 7a, no armature has been installed yet.

Figure 7B:
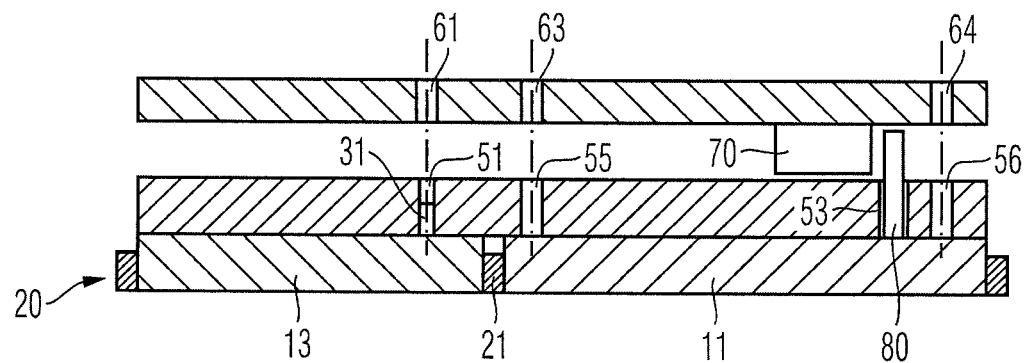
FIG. 7b shows a schematic section of a control device with installed armatures.

In the view shown in FIG. 7b, armature 80 of control assembly 11 is mounted. Armature 80 is led through a recess 53 in circuit board 50 and lies beside an actuator coil 70 of carrier element 60. Armature 80 is connected with a touch-sensitive input surface of control assembly 11 such that the latter can be activated for haptic feedback by means of energizing actuator coil 70. This connection between armature 80 and the touch-sensitive input surface is not shown in detail in FIG. 7b, but can be completed in a manner know to persons skilled in the art. The arrangement of the actuator, consisting of actuator coil and armature, is only indicated schematically in FIG. 7b and can be accomplished in a known manner. Armature 80 is preferably a flat armature formed as an angular member in which one leg is directly or indirectly connected with the touch-sensitive input surface while the outer surface of the other leg points to actuator coil 70. FIG. 7b shows only this leg of the angular member that points toward actuator coil 70.

In two or more control assemblies with touch-sensitive input surface and haptic feedback, several armatures are installed in the control device. For this, the armatures should preferably be installed at a predetermined spacing x from the actuator coils. In particular when flat armatures are used, it would otherwise be a disadvantage that the force produced by the actuator depends to a great degree on the spacing between the armature and the coil core.

The present disclosure therefore provides that in case of a bond consisting of several control assemblies, a common circuit board and a carrier element as described, the spacing d between an actuator coil and a site on the corresponding control assembly is first determined. Depending on this spacing, a suitable armature is determined for each control assembly with which the required spacing x can be achieved as accurately as possible.

For example, this spacing can be determined by means of a camera which takes a picture of the section between the actuator coil a section of the control assembly. Spacing d can be determined with the aid of reference points in the picture and an appropriate image evaluation. Preferably, this spacing d is transmitted to a computer unit (not shown) which uses distance d to determine an armature that suits the measured gap.

Figure 8:
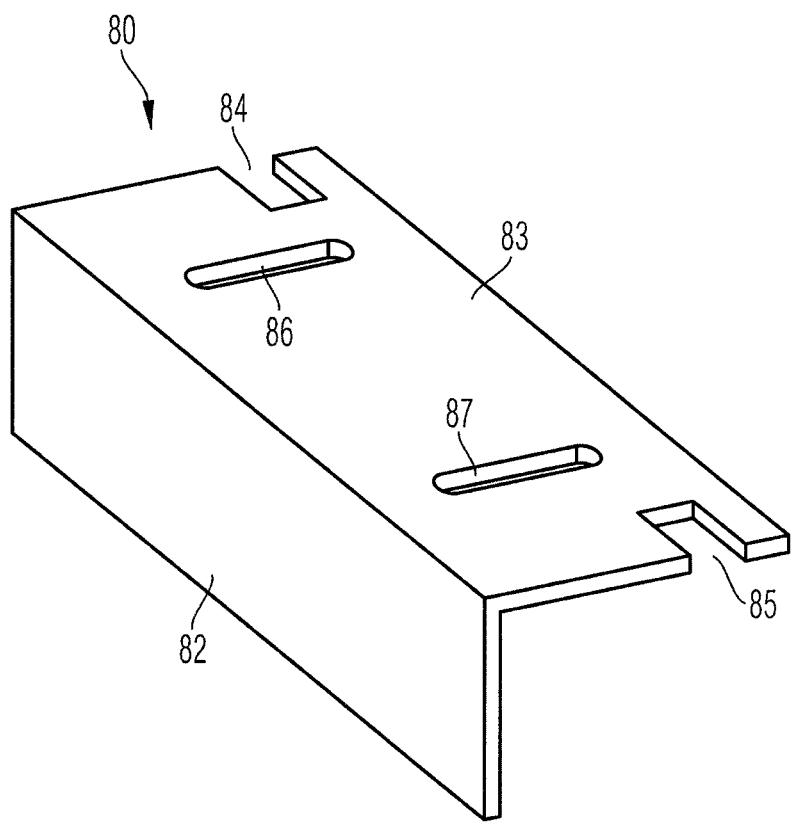
FIG. 8 shows a three-dimensional view of a first embodiment of a flat armature in the form of an angular member.

To select a suitable armature, a quantity of at least two armatures is provided to be chosen from. These armatures are of different design such that the most suitable can be selected from the quantity of armatures. FIG. 8 shows an embodiment of a possible armature in the form of a flat armature 80. This flat armature 80 has the form of an angular member with two legs 82 and 83 at a 90° angle to each other. The purpose of the first leg 82 is to point in the direction of an actuator coil with its outer surface, while the second leg 83 of the angular member can be connected with the installation site of a control assembly. For this purpose, the second leg is provided with connection elements 84 and 85. Preferably, these connection elements 84, 85 are recesses or grooves in which corresponding projections or tongues can be positively connected to the control assemblies. In addition, other receptors can be provided such as two longitudinal holes 86 and 87 with which the flat armature 80 can be additionally fastened to the control assembly. For example, recesses 84, 85 can serve only to align the flat armature 80 with the corresponding control assembly while the actual fastening is accomplished via screw connections in longitudinal holes 86, 87.

Flat armature 80 of FIG. 8 shows recesses 84, 85 which are very close to the longitudinal edge of the second leg 83 of flat armature 80. If such a flat armature 80 is installed in an installation assembly according to FIG. 7a, these recesses 84, 85 would be aligned with the protrusions of the control assembly and the flat armature 80 would be installed accordingly. In that case, the first leg 82 would be relatively close to the actuator coil, whereby the remaining spacing between flat armature 80 and the actuator coil could be too small. To avoid this, additional flat armatures are available whose recesses are arranged in other positions to accomplish another installation position of a flat armature.

Figure 9:
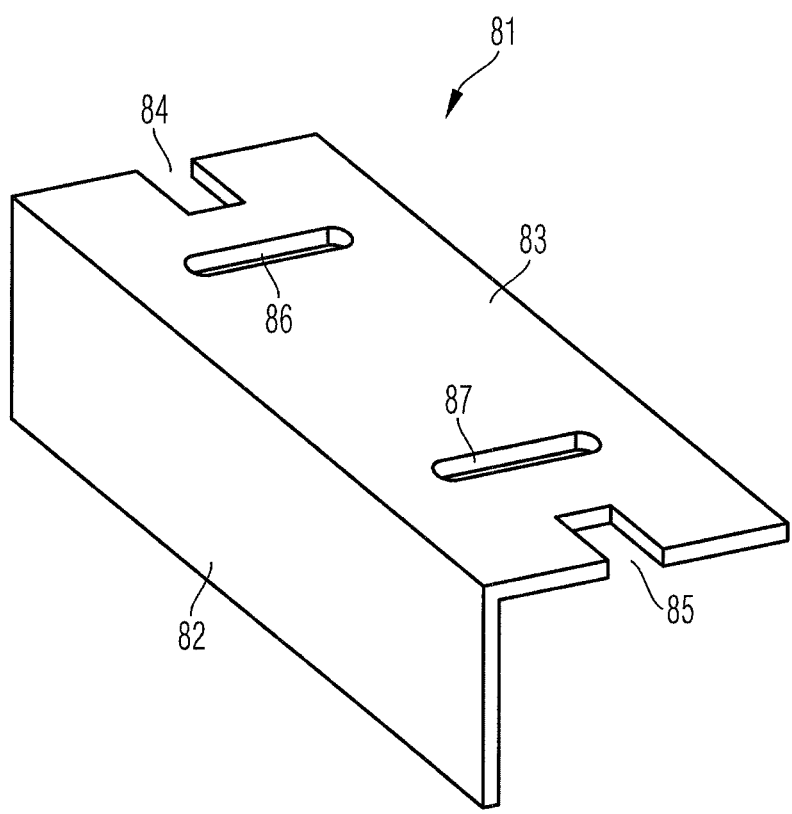
FIG. 9 shows a three-dimensional view of a second embodiment of a flat armature in the form of an angular member.

For example, FIG. 9 shows a second embodiment of a flat armature 81, whose design substantially corresponds to that shown in FIG. 8, for which reason the same reference numbers are used for both components. However, the recesses 84, 85 are now no longer near the longitudinal edge of the second leg 83, but approximately in the middle of the two lateral edges. If this flat armature 81 is installed in an installation assembly according to FIG. 7a, the first leg 82 would lie farther away from the actuator coil than with the flat armature 80 of FIG. 8. This flat armature 81 could therefore be more suitable for creating a certain target spacing X from the actuator coil. Furthermore, the quantity of available flat armatures can comprise embodiments which provide other spacings between the actuator coil and the flat armature.

Figure 10:
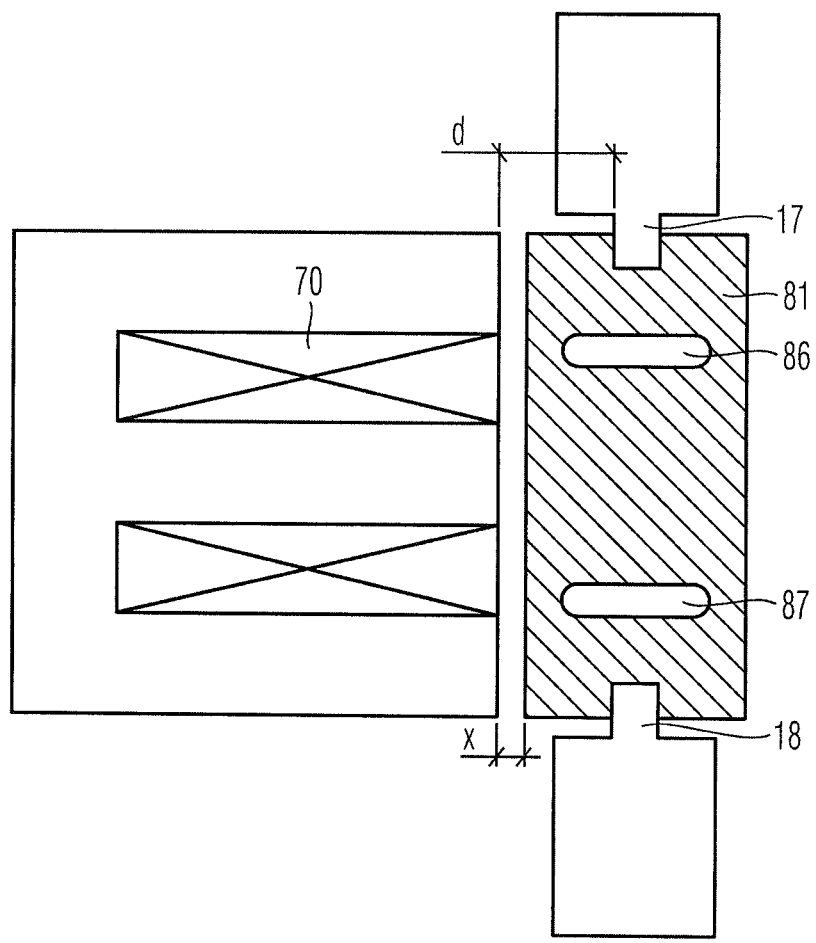
FIG. 10 shows an actuator with an installed flat armature.

An actuator with an installed flat armature 81 is shown in FIG. 10. This figure also shows a possible point for the prior measuring of a spacing d between actuator coil 70 and a carrier element of the control assembly. This spacing d is thus measured before an armature is installed. FIG. 10 also shows how protrusions 17 and 18 on the carrier elements of the control assembly engage in the connecting elements on the lateral sides of armature 81.

Installation of armature 81 results in an actual spacing x between actuator coil 70 and flat armature 81. Preferably, a flat armature is selected from the quantity of available flat armatures whose actual spacing x deviates the least from a target spacing X. For example, this target spacing X depends on the predetermined maximum deviation of the flat armature. With this maximum deviation, the remaining spacing between the actuator coil and the flat armature is to be minimized, typically resulting in target spacings X of 0.1-0.8 mm.

To ensure that the target spacing X does not fall below target, it can be provided that the flat armature chosen from the quantity of flat armatures is that in which the resulting actual spacing x is greater than a target spacing X and also has the least deviation from this target spacing X. Thus, a suitable flat armature is selected depending on the spacing d determined in the installation assembly in which the spacing x from the actuator coil after installation is the smallest possible while flat armature can still move freely within its maximum deviation after installation. Preferably, the target spacing X will not be zero.

To allow such a selection of a suitable flat armature from the quantity of available flat armatures, the resulting actual spacing x is first determined which is due to various spacings x between actuator coil and a point on a control assembly. It is thus known for various spacings d which actual spacing x results when various flat armatures are installed.

For each of the two control assemblies 11 and 12, the spacing d between the respective actuator coil 70, 71 and a site on the control assembly is determined, and the suitable flat armature is selected. It can therefore happen that a flat armature with a different arrangement of connecting elements 84, 85 is installed at the first control assembly 11 than at the second control assembly. For example, at control assembly 11 a flat armature 80 with lateral connecting elements 84, 85 can be installed while the flat armature 81 at the second control assembly 12 is a flat armature of another type with central connecting elements 84, 85.

The invention claimed is:

1. A process for manufacturing a control device with at least one touch-sensitive input surface that is activated for haptic feedback with an electromagnetic actuator, for which the actuator includes an actuator coil and an armature that is activated by energizing the actuator coil, the process comprising:
   providing at least two control assemblies, at least one of which comprises a touch-sensitive input surface and an assembly site for installing an armature;
   inserting the at least two control assemblies in an installation in which the control assemblies are aligned with a minimum spacing between each other;
   attaching a common circuit board to the at least two control assemblies, whereby the circuit board has at least one recess through which an armature passes;
   connecting a common carrier element with the at least two control assemblies and the circuit board, whereby one actuator coil is attached to the carrier element for a control assembly with a touch-sensitive input surface;
   installing one armature to the assembly site of each control assembly with touch-sensitive input surface, whereby the armature passes through the recess in the circuit board and is installed at a spacing from a corresponding actuator coil of the carrier element on the respective control assembly; and
   determining the spacing, wherein the spacing is taken into account in a calibration of the actuator.

2. The process of claim 1, wherein the carrier element is screw-connected right through the common circuit board with the control assemblies.

3. The process of claim 1, wherein the installation is removed after the carrier element is connected with the control assemblies and the circuit board.

4. The process of claim 1, further comprising:
   providing at least two armatures are, each of the at least two armatures having at least one connecting element for connecting the respective armatures to a control assembly with a touch-sensitive input surface, wherein the connecting element on both armatures is arranged differently;
   determining a spacing between the actuator coil and a predetermined point on the associated control assembly after connecting a carrier element to the at least two control assemblies and the circuit board;
   selecting an armature from among the at least two armatures, which when connected to the control assembly lies at an actual spacing from the actuator coil, which complies with a predetermined specification; and
   determining the actual spacing depending on the determined spacing; and
   attaching the selected armature to the control assembly, where in the armature is led through a recess in the common circuit board.

5. The process of claim 4, wherein the selected armature is at the actual spacing from the associated actuator coil that is greater than a predetermined target spacing X while having the smallest deviation from the target spacing.

6. The process of claim 4, wherein the at least one touch-sensitive input surface is activated for haptic feedback that is either parallel or orthogonal to the direction of an extension of the at least one touch-sensitive input surface.

* * * * *